United States Patent
Hu et al.

(10) Patent No.: US 10,826,027 B2
(45) Date of Patent: Nov. 3, 2020

(54) ORGANIC LIGHT-EMITTING DIODE COMPONENT AND MANUFACTURING METHOD THEREOF

(71) Applicant: BOE TECHNOLOGY GROUP CO., LTD., Beijing (CN)

(72) Inventors: Chunjing Hu, Beijing (CN); Bin Bo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/335,650

(22) PCT Filed: Sep. 12, 2018

(86) PCT No.: PCT/CN2018/105224
§ 371 (c)(1),
(2) Date: Mar. 21, 2019

(87) PCT Pub. No.: WO2019/052467
PCT Pub. Date: Mar. 21, 2019

(65) Prior Publication Data
US 2020/0028122 A1    Jan. 23, 2020

(30) Foreign Application Priority Data
Sep. 13, 2017   (CN) .......................... 2017 1 0823756

(51) Int. Cl.
*H01L 51/56*     (2006.01)
*H01L 27/32*     (2006.01)
*H01L 51/50*     (2006.01)

(52) U.S. Cl.
CPC .......... *H01L 51/56* (2013.01); *H01L 27/3246* (2013.01); *H01L 27/3283* (2013.01); *H01L 51/5044* (2013.01); *H01L 2251/558* (2013.01)

(58) Field of Classification Search
CPC ............ H01L 27/3246; H01L 27/3283; H01L 27/3295
(Continued)

(56) References Cited

U.S. PATENT DOCUMENTS

2006/0284204 A1* 12/2006 Yamazaki ........... H01L 51/5262
                                                            257/98
2008/0284689 A1    11/2008 Kim et al.
(Continued)

FOREIGN PATENT DOCUMENTS

CN           1852625 A       4/2007
CN         206250196 U       6/2017

OTHER PUBLICATIONS

International Search Report and Written Opinion dated Nov. 28, 2018 in PCT/CN2018/105224.

*Primary Examiner* — David Vu
*Assistant Examiner* — Brandon C Fox
(74) *Attorney, Agent, or Firm* — Syncoda LLC; Feng Ma

(57) ABSTRACT

An organic light-emitting diode (OLED) component includes a substrate; a pixel defining layer and a plurality of first electrodes over the substrate; an insulating layer correspondingly disposed over the pixel defining layer; a first light-emitting layer over each first electrode; and a charge generation layer over the first light-emitting layer. The plurality of first electrodes are physically separated from one another by the pixel defining layer. The insulating layer is configured to facilitate manufacturing of the OLED component, such that after formation of the charge generation layer without a mask, portions thereof positionally corresponding to any two adjacent first electrodes are physically separated by the insulating layer. The OLED component can be a white light organic light-emitting diode (WOLED) component
(Continued)

including at least one other light-emitting layer in addition to the first light-emitting layer.

20 Claims, 8 Drawing Sheets

(58) Field of Classification Search
USPC .................................................. 257/40, 98
See application file for complete search history.

(56) References Cited

U.S. PATENT DOCUMENTS

| | | | |
|---|---|---|---|
| 2012/0205633 A1* | 8/2012 | Ikeda | H01L 51/50 257/40 |
| 2012/0208303 A1* | 8/2012 | Yamazaki | H01L 51/56 438/23 |
| 2015/0060825 A1* | 3/2015 | Song | H01L 51/5278 257/40 |
| 2019/0172876 A1* | 6/2019 | Xia | H01L 27/3209 |

* cited by examiner

ORGANIC LIGHT-EMITTING DIODE COMPONENT AND MANUFACTURING METHOD THEREOF

CROSS-REFERENCE TO RELATED APPLICATION

The present application claims priority to Chinese Patent Application No. 201710823756.X filed on Sep. 13, 2017, the disclosure of which is hereby incorporated by reference in its entirety.

TECHNICAL FIELD

The present disclosure relates generally to the field of display technologies, and more specifically to an organic light-emitting diode (OLED) component and manufacturing method thereof.

BACKGROUND

Because organic light-emitting diode (OLED) components have the advantages such as fast response speed and wide color gamut, they have become the mainstream applications in display technology field. Compared with ordinary OLED components, white light organic light-emitting diode (WOLED) components have the advantages of longer working life and higher light-emitting efficiency, and therefore, they have been more widely used.

In an existing WOLED component, a light-emitting unit of the white organic light-emitting diode is typically composed of a plurality of light-emitting sub-units, each of a different color. Specifically, in a light-emitting unit, the plurality of light-emitting sub-units having different colors are stacked and connected in series through a charge generation layer. The material of the charge generation layer according to existing technology typically comprises an organic material doped with the element lithium.

SUMMARY

The purpose of the present disclosure is to provide a WOLED component and its manufacturing method to prevent the color mixing phenomenon and improve the display effect of the WOLED component.

In order to achieve the aforementioned purpose, embodiments of the present disclosure adopt the following technical solutions for the WOLED component.

In one aspect, a method for manufacturing an organic light-emitting diode (OLED) component, comprising:

providing a substrate, a plurality of first electrodes, and a pixel defining layer, wherein that the plurality of first electrodes and the pixel defining layer are over the substrate, and the plurality of first electrodes are physically separated from one another by the pixel defining layer;

forming an insulating layer over, and positionally corresponding to, the pixel defining layer; and forming a first light-emitting layer over, and positionally corresponding to, each of the plurality of first electrodes;

forming a charge generation layer over the insulating layer and the first light-emitting layer without a mask;

Herein, the insulating layer and the charge generation layer are configured such that after formation of the charge generation layer, portions thereof positionally corresponding to any two adjacent first electrodes are physically separated by the insulating layer.

In the method as described above, the insulating layer can be configured such that an orthographic projection of a side surface thereof facing any one of the plurality of first electrodes on an upper surface of the pixel defining layer casts a shadow thereupon.

As such, according to some embodiments of the disclosure, the insulating layer can be configured to have a shape of an inverted trapezoidal in a cross section thereof along a plane perpendicular to the substrate.

In the method described above, the step of forming a charge generation layer over the insulating layer and the first light-emitting layer without a mask can be performed by at least one of evaporation, deposition, or sputtering.

In the method described above, the first light-emitting layer can be formed on each of the plurality of first electrodes, and it is further configured such that a sum of a thickness of the first light-emitting layer and a thickness of the charge generation layer is smaller than a thickness of the insulating layer.

According to some embodiments of the disclosure, between the step of forming an insulating layer over, and positionally corresponding to, the pixel defining layer and the step of forming a first light-emitting layer over, and positionally corresponding to, each of the plurality of first electrodes, the method further comprises:

forming a first hole injection layer and a first hole transport layer successively on, and positionally corresponding to, each of the plurality of first electrodes.

Herein, it is configured such that a sum of a thickness of the first hole injection layer, a thickness of the first hole transport layer, a thickness of the first light-emitting layer, and a thickness of the charge generation layer is smaller than a thickness of the insulating layer.

According to some embodiments of the method, the step of forming a first light-emitting layer over, and positionally corresponding to, each of the plurality of first electrodes is performed by at least one of evaporation, deposition, or sputtering, without a mask.

The method as described above can further comprise:

forming a second electrode layer over the charge generation layer, such that portions thereof positionally corresponding to any two adjacent first electrodes are integrated with one another.

According to some embodiments of the disclosure, between the step of forming a charge generation layer over the insulating layer and the first light-emitting layer without a mask and the step of forming a second electrode layer over the charge generation layer, the method as described above further comprises:

forming at least one other light-emitting layer over the charge generation layer and below the second electrode layer.

Herein, the first light-emitting layer and the at least one other light-emitting layer are configured to respectively emit a light of a different primary color which, upon mixing together, become a white light. As such, the embodiments of the method described herein are specifically configured for manufacturing a white light organic light-emitting diode (WOLED) component.

According to some embodiments of the method as described above, the step of forming at least one other light-emitting layer over the charge generation layer and below the second electrode layer comprises:

forming a second light-emitting layer over the charge generation layer; and forming a third light-emitting layer over the second light-emitting layer.

The method can, according to some embodiments of the disclosure, further comprise, between the step of forming a charge generation layer over the insulating layer without a mask and the first light-emitting layer and the forming at least one other light-emitting layer over the charge generation layer and below the second electrode layer:

forming a second hole injection layer and a second hole transport layer successively over the charge generation layer.

In another aspect, the present disclosure further provides an organic light-emitting diode (OLED) component, which can be substantially obtained by the method as described above.

The OLED component comprises a substrate; a pixel defining layer and a plurality of first electrodes over the substrate; an insulating layer positionally correspondingly disposed over the pixel defining layer; a first light-emitting layer over each of the plurality of first electrodes; and a charge generation layer over the first light-emitting layer. The plurality of first electrodes are physically separated from one another by the pixel defining layer, and the charge generation layer is configured such that portions thereof positionally corresponding to any two adjacent first electrodes are physically separated by the insulating layer.

Herein, the insulating layer can be further configured such that an orthographic projection of a side surface thereof facing any one of the plurality of first electrodes on an upper surface of the pixel defining layer casts a shadow thereupon.

As such, according to some specific embodiments of the organic light-emitting diode component, the insulating layer can have a shape of an inverted trapezoidal in a cross section thereof along a plane perpendicular to the substrate.

The organic light-emitting diode component can further comprise at least one other light-emitting layer over the charge generation layer.

According to some embodiments of disclosure, the first light-emitting layer and the at least one other light-emitting layer can be configured to respectively emit a light of a different primary color which, upon mixing together, become a white light. As such, these embodiments of the organic light-emitting diode component are substantially white light organic light-emitting diode (WOLED) components.

According to some embodiments of the organic light-emitting diode component described above, the at least one other light-emitting layer comprises a second light-emitting layer over the charge generation layer; and a third light-emitting layer over the second light-emitting layer.

Herein, specifically the first light-emitting layer, the second light-emitting layer, and the third light-emitting layer can be configured to respectively emit a blue light, a red light, and a green light.

According to some embodiments, the organic light-emitting diode component further comprises a first hole injection layer each of the plurality of first electrodes; and a first hole transport layer over the first hole injection layer.

In some of the embodiments as described above, the organic light-emitting diode component further comprises a second electrode over the at least one other light-emitting layer, and the second electrode has an integrated structure.

In any of the embodiments of the light organic light-emitting diode component described above, the insulating layer comprises at least one of a photopolymeric photosensitive resin or a light compound photosensitive resin.

Compared with existing technologies, the WOLED component of the present disclosure has the following beneficial effects:

In the WOLED component provided by the present disclosure, the first light-emitting layer and the charge generation layer of each pair of adjacent light-emitting units are separated by the insulating member configured over the pixel defining layer, as a result, when the WOLED component is lighted up for a long time and cause the WOLED component to become heated, in a lighted up light-emitting unit, even if the bonding capability between the organic molecule and the elemental lithium in the charge generation layer of the light-emitting unit will become aged, when the charge generation layer transmits charges to the first light-emitting layer of the light-emitting unit vertically, it will also transmits charges horizontally, however, because the charge generation layer of the light-emitting unit and the charge generation layer of the adjacent light-emitting unit are separated by the insulating member, the charge generation layer of the light-emitting unit will not transmit the charges to the charge generation layer of adjacent light-emitting unit horizontally, as a result, the adjacent light-emitting unit will not be lighted up, as a result, color mixing phenomena is avoided and the display effect of the WOLED component is improved.

Compared with existing technologies, the beneficial effects of the manufacturing method of the WOLED component provided by the present disclosure are the same as the aforementioned beneficial effects of the WOLED component, it will not be repeated herein.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Figure 1:
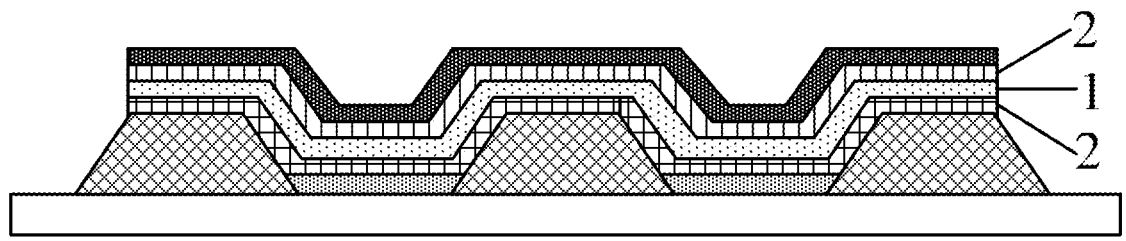
FIG. 1 is a structural diagram of a WOLED component according to one existing technology.

FIG. 1 illustrates a structural diagram of the WOLED component according to one existing display technology. In the WOLED component illustrated in FIG. 1, the organic material doped with lithium is adopted as the material for the charge generation layer 1.

When the WOLED component is lighted for a long time, the WOLED component becomes heated, and the bonding capability between the organic molecule and the elemental lithium in the charge generation layer 1 can become aged.

As a result, in a light-emitting unit, when the charge generation layer 1 vertically transmits charges to the light-emitting layer 2 in each of the two light-emitting sub-units that are immediately above and below the charge generation layer 1, the charge generation layer 1 also horizontally transmits charges to the light-emitting layer 2 in the adjacent light-emitting unit. Consequently, the light-emitting unit at the sides of the light-emitting unit that are lighted will also be lighted. In turn, the issue of color mixing will occur, and the display effect of the WOLED component will be negatively influenced.

In order to avoid the above mentioned issue of color mixing in an existing WOLED component so as to improve the display effect of the WOLED component, embodiments of the present disclosure adopt the following technical solutions.

In a first aspect, an organic light-emitting diode (OLED) component is provided.

The OLED component comprises: a substrate; a pixel defining layer over the substrate; a plurality of first electrodes over the substrate, which are physically separated from one another by the pixel defining layer; an insulating layer, which is positionally correspondingly disposed over the pixel defining layer; a first light-emitting layer over each of the plurality of first electrodes; and a charge generation layer over first light-emitting layer, which is configured such that portions thereof positionally corresponding to any two adjacent first electrodes are physically separated by the insulating layer.

Herein the insulating layer is configured, during the manufacturing process of the OLED component, to facilitate the formation of the charge generation layer without a mask, which can typically be performed by evaporation, deposition, or sputtering.

The OLED component as described above can specifically be a white light organic light-emitting diode (WOLED) component. The WOLED component includes at least one other light-emitting layer in addition to the first light-emitting layer, and the first light-emitting layer and the at least one other light-emitting layer are configured to respectively emit a light of a different primary color which, upon mixing together, become a white light.

Alternatively, the OLED component as described above can be a non-WOLED component, and can include at least one other light-emitting layer in addition to the first light-emitting layer.

Figure 2A:
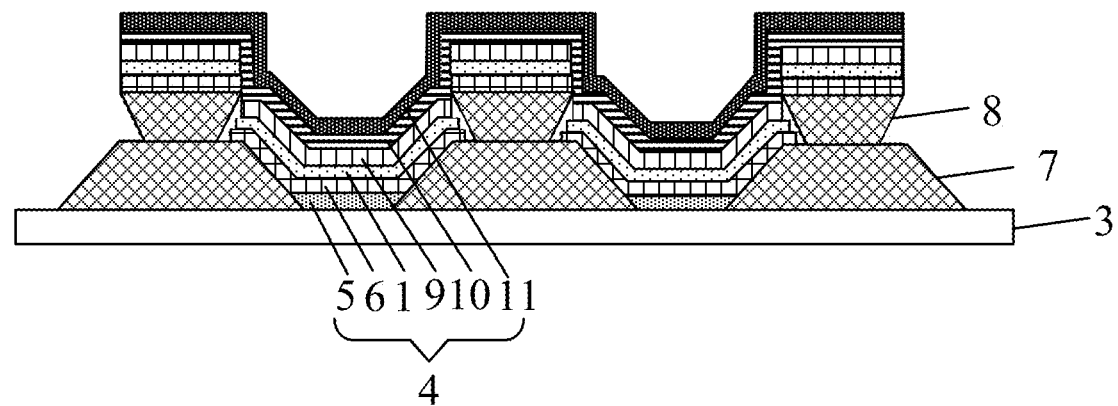
FIG. 2A is a structural diagram of a WOLED component provided by some embodiments of the present disclosure.

FIG. 2A is a structural diagram of a WOLED component according to some embodiments of the present disclosure. As shown in FIG. 2A, the WOLED component herein comprises a substrate 3 and a plurality of light-emitting units 4 which are disposed over the substrate 3. Specifically, each of the plurality of light-emitting units 4 comprises an anode 5, a first light-emitting layer 6 over the anode 5, and a charge generation layer 1 over the first light-emitting layer 6.

The anodes 5 in each pair of adjacent light-emitting units 4 are separated by a pixel defining layer 7 to thereby allow the anode 5 in each of the plurality of light-emitting units 4 to be insulated from one another. Furthermore, the first light-emitting layers 6 and the charge generation layers 1 in each pair of adjacent light-emitting units 4 are separated by an insulating member 8 arranged over the pixel defining layer 7 to thereby allow the first light-emitting layer 6, and the charge generation layer 1 as well, of each of the plurality of light-emitting units 4 to be insulated from one another.

Herein, it is noted that the insulating member 8 can be regarded as part of an insulating layer in the WOLED component.

In the embodiments of the WOLED component as shown in FIG. 2A, each of the plurality of light-emitting unit 4 further comprises a second light-emitting layer 9, a third light-emitting layer 10, and a cathode 11. The second light-emitting layer 9 is arranged over the charge generation layer 1; the third light-emitting layer 10 is arranged over the second light-emitting layer 9; and the cathode 11 is arranged over the third light-emitting layer 10. It is further configured such that the cathode 11 in each of the plurality of light-emitting unit 4 is electrically connected to one another.

Herein, the material of the anode 5 can optionally comprise a metal, an indium tin oxide (ITO), or a combination of a metal and an ITO. The material of the charge generation layer 1 may comprise an organic or inorganic material containing elemental lithium. The material of the cathode 11 may comprise a metal such as aluminum.

In the aforementioned embodiments of the WOLED component, each of the plurality of light-emitting units 4 substantially comprise three light-emitting sub-units (i.e. a first light-emitting sub-unit, a second light-emitting sub-unit, and a third light-emitting sub-unit) aligned vertically in the each of the plurality of light-emitting units 4.

The first light-emitting sub-unit comprises the anode 5, the first light-emitting layer 6, and the charge generation layer 1. When the light-emitting unit 4 is lighted up, the surface of the charge generation layer 1 facing the first light-emitting layer 6 is equivalent to the cathode of the light-emitting sub-unit, which transmits electrons to the first light-emitting layer 6, and the anode 5 also transports holes to the first light-emitting layer 6. When the holes and the electrons are combined in the first light-emitting layer 6, the first light-emitting layer 6 is allowed to emit a first light.

The second light-emitting sub-unit comprises the charge generation layer 1, the second light-emitting layer 9, and the third light-emitting layer 10. When the light-emitting unit 4 is lighted up, the side of the charge generation layer 1 facing the second light-emitting layer 9 is equivalent to the anode of the light-emitting sub-unit, which transmits holes to the second light-emitting layer 9, and the side of the third light-emitting layer 10 facing the second light-emitting layer 9 is equivalent to the cathode of the light-emitting sub-unit, which transmits electrons to the second light-emitting layer 9. When the holes and electrons are combined in the second light-emitting layer 9, the second light-emitting layer 9 is allowed to emit a second light.

The third light-emitting sub-unit comprises the second light-emitting layer 9, the third light-emitting layer 10, and the cathode 11. When the light-emitting unit 4 is lighted up, the side of the second light-emitting layer 9 facing the third light-emitting layer 10 is equivalent to the anode of the light-emitting sub-unit, which transmits holes to the third light-emitting layer 10, and the cathode 11 transmits electrons to the third light-emitting layer 10. When the holes and electrons are combined in the third light-emitting layer 10, the third light-emitting layer 10 is allowed to emit a third light.

It is configured such that when the lights respectively emitted by the first light-emitting layer 6, the second light-emitting layer 9 and the third light-emitting layer 10 (i.e. the first light, the second light, and the third light) are mixed, the light-emitting unit 4 emit a white light.

According to some embodiments of the disclosure, the first light-emitting layer 6 is configured to emit a blue light, the second light-emitting layer 9 is configured to emit a red light, and the third light-emitting layer 10 is configured to emit a green light. As such, when the red light emitted by the second light-emitting layer 9 and the green light emitted by the third light-emitting layer 10 are mixed, a yellow light is resulted thereby, and the yellow light is further mixed with the blue light emitted by the first light-emitting layer 6, to thereby allow the light-emitting unit 4 to emit a white light.

Figure 2B:
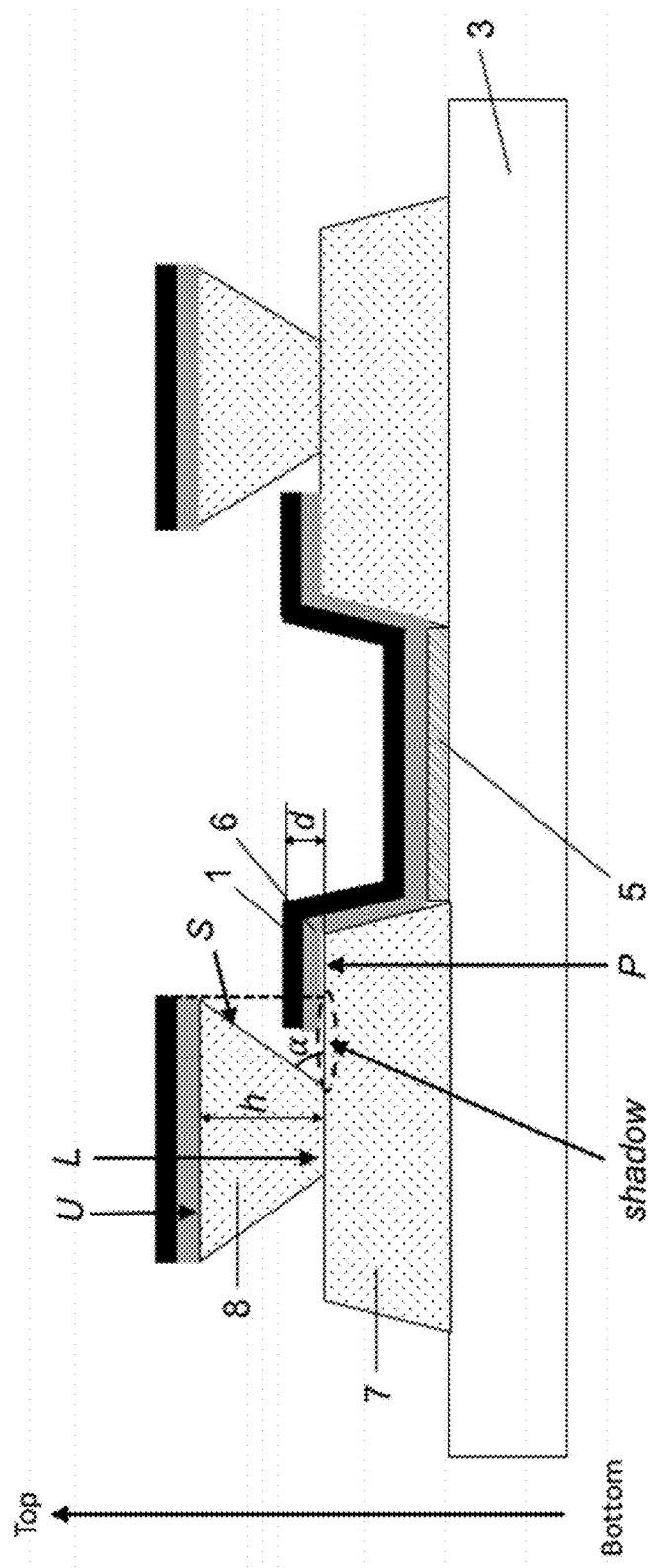
FIG. 2B is a simplified view of the WOLED component illustrated in FIG. 2A.

With reference to FIG. 2B, which is a simplified view of the WOLED component illustrated in FIG. 2A, where the anode 5, the first light-emitting layer 6, and the charge generation layer 1 in only one light-emitting unit 4 are shown.

As illustrated in FIG. 2B, in the WOLED component, the first light-emitting layer 6 and the charge generation layer 1 in each pair of adjacent light-emitting units 4 are positionally separated by the insulating member 8 that are disposed over the pixel defining layer 7. In other words, the first light-emitting layer 6 and the charge generation layer 1 in one light-emitting unit 4 are physically disconnected with the first light-emitting layer 6 and the charge generation layer 1 in a light-emitting unit 4 that is immediately adjacent to the one light-emitting unit 4 by the insulating member 8.

As such, in any one of the plurality of light-emitting units 4 in the embodiments of the WOLED component as described above, even though the aging bonding capability between the organic molecule and the elemental lithium in the charge generation layer 1 due to the heat generated when it is lighted up can still cause the charge generation layer 1 to transmit charges horizontally, yet because of the presence of the insulating member 8 between the charge generation layer 1 of one light-emitting unit 4 and the charge generation layer 1 in an adjacent light-emitting unit 4, the charge will not be able to be transmitted to the charge generation layer 1 in the adjacent light-emitting unit 4.

As a result, the adjacent light-emitting unit 4 will not be lighted up. Thereby, the issue of color mixing can be avoided and the display effect of the WOLED component can be improved.

In the embodiments of the WOLED component as illustrated in FIG. 2B (also shown in FIG. 2A), the insulating member 8 has a shape of an inverted trapezoid in a bottom-to-top direction of the figure (as shown by the upward arrow in FIG. 2B).

As specifically illustrated in FIG. 2B, because of the inverted trapezoid shape for the insulating member 8, the area of an upper surface (U) of the insulating member 8 is larger than the area of a lower surface (L) of the insulating member 8 that is in contact with the pixel defining layer 7, and the angle ($\alpha$) between the side surface (S) of the inverted trapezoidal insulating member 8 and the upper surface (P) of the pixel defining layer 7 is an acute angle (i.e. less than 90°).

Due to the above inverted trapezoid shape of the insulating member 8, during the manufacturing process of the WOLED component, when depositing the first light-emitting layer 6 and the charge generation layer 1, the first light-emitting layer 6 and the charge generation layer 1 deposited will not climb along a side of the inverted trapezoidal insulating member 8, which is substantially caused by the shadow effect of the side surface (S) of the inverted trapezoidal insulating member 8.

As a result, the first light-emitting layer 6 and the charge generation layer 1 will be separated (or more specifically physically disconnected) from the first light-emitting layer 6 and the charge generation layer 1 deposited over the upper surface of the insulating member 8, further, the separation of the first light-emitting layer 6 and charge generation layer 1 of each pair of adjacent light-emitting units 4 is achieved.

Figure 2C:
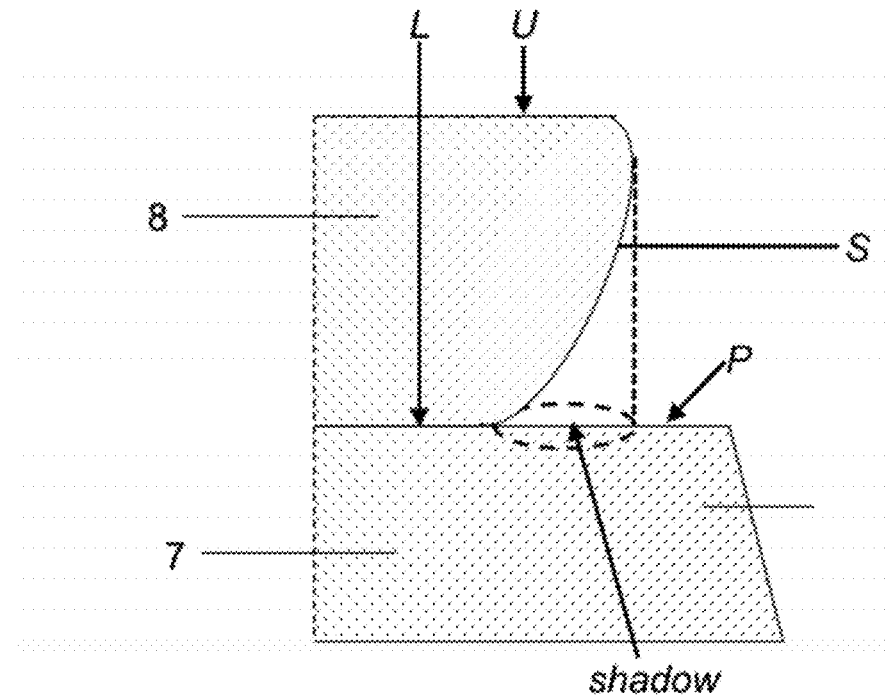
FIG. 2C shows a structural diagram of a WOLED component having an insulting member with an irregular side surface according to some embodiments of the present disclosure.

It is noted that in addition to the inverted trapezoid shape, the insulating member 8 disposed on the upper surface P of the pixel defining layer 7 can have other shape (e.g. regular shape, irregular shape, smooth shape, or curved shape, etc.) as well, as long as the side surface S (which specifically faces the light-emitting unit 4) of the insulating member 8 can cast a shadow (as shown by the oval shaped box) on the upper surface P of the pixel defining layer 7, as specifically illustrated in FIG. 2C. In other words, the orthographic projection of the side surface (S) of the insulating member 8 on the upper surface (P) of the pixel defining layer 7 can form a shadow thereon.

The above configuration of the side surface S of the insulating member 8 can have a beneficial effect for the manufacturing process of the WOLED component, whereby the deposition of the charge generation layer 1 on the first light-emitting layer 6 can, due to the shadow effect of the side surface S of the insulating member 8, directly cause that the charge generation layer 1 in one light-emitting unit 4 is physically disconnected with the charge generation layer 1 in its adjacent light-emitting unit 4.

It is noted however, that in order to ensure that the side surface S of the insulating member 8 has the expected shadow effect such that the charge generation layer 1 in each of the plurality of light-emitting units 4 is physically disconnected with one another during the manufacturing process of the charge generation layer 1, a distance of an upper surface of the charge generation layer 1 to the upper surface P of the pixel defining layer 7 (which is substantially a sum of a thickness of the first light-emitting layer 6 and a thickness of the charge generation layer 1, as denoted as d shown in FIG. 2B) needs to be smaller than a distance of the upper surface U of the insulating member 8 to the upper surface P of the pixel defining layer 7 (which is substantially a thickness of the insulating member 8, as denoted as h shown in FIG. 2B). Thus specifically, $$h > d;\tag{1}$$

In the embodiments of the WOLED component illustrated in FIG. 2A and FIG. 2B, the first light-emitting layer 6, the charge generation layer 1, the second light-emitting layer 9, the third light-emitting layer 10 and the cathode 11 are arranged successively in layers (i.e. sequentially stacked in layers), and thus the cathode 11 is arranged at a top-most layer.

Optionally, with reference to FIG. 2A, it can be further configured such that a distance of an upper surface of the cathode 11 to the upper surface P of the pixel defining layer 7 (which is substantially a sum of a thickness of the first light-emitting layer 6, a thickness of the charge generation layer 1, a thickness of the second light-emitting layer 9, and a thickness of the third light-emitting layer 10, and a thickness of the cathode 11 in the embodiment shown in FIG. 2A, denoted as a (not shown in the drawings)) is larger than, or equal to, the thickness h of the insulating member 8 (as illustrated in FIG. 2B). Specifically, $$a \geq h; \qquad (2)$$

It is noted that the above mentioned positional arrangement of, as well as the thickness relationship between, the various layers in the WOLED component described herein can have an additional beneficial effect in the manufacturing process of the WOLED component.

More specifically, when forming the cathode 11 by deposition over the first light-emitting layer 6, the charge generation layer 1, the second light-emitting layer 9, and the third light-emitting layer 10 that have been successively formed during the manufacturing process of the WOLED component, the deposited cathode 11 can climb along the sides of the first light-emitting layer 6, the charge generation layer 1, the second light-emitting layer 9, and the third light-emitting layer 10 deposited successively in layers on the upper surface of the insulating member 8, and consequently, the layer of the cathode 11 formed thereby is not separated by the insulating member 8 but instead, form an integrated structure in the WOLED component.

As a result, the whole layer of cathode 11 that covers the upper surface of the insulating member 8 can be formed through a one-time depositing process yet still allowing normal light emission for the WOLED component.

However, it is noted that according to some other embodiments, the cathode 11 in each light-emitting unit 4 can be separated from one another, and it can be realized by controlling that the distance a of an upper surface of the cathode 11 to the upper surface P of the pixel defining layer 7 (i.e. the sum of the thickness of the first light-emitting layer 6, the thickness of the charge generation layer 1, the thickness of the second light-emitting layer 9, and the thickness of the third light-emitting layer 10, and the thickness of the cathode 11) is smaller than the thickness h of the insulating member 8, or more specifically:

$$a < h; \qquad (3)$$

Depending on the different embodiments of the disclosure, in the WOLED component, the second light-emitting layer 9 of each pair of adjacent light-emitting unit 4 can be configured to be separated from one another, or can be configured to form an integrated structure.

Figure 3:
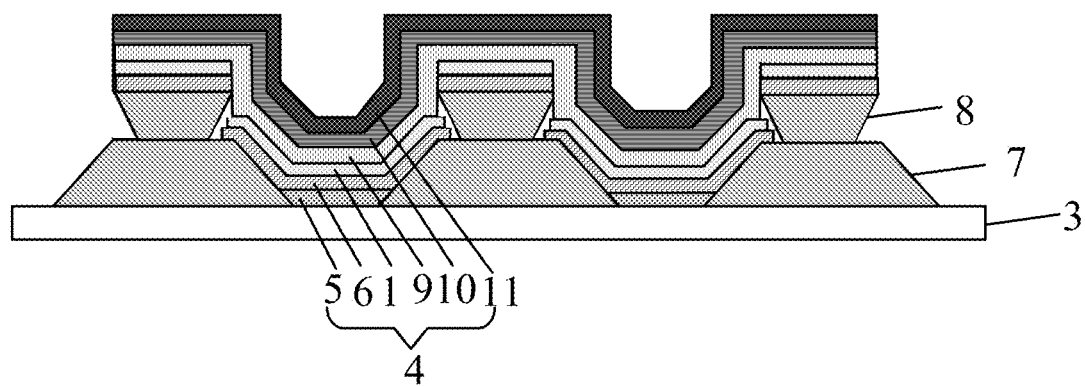
FIG. 3 is a structural diagram of a WOLED component provided by some other embodiments of the present disclosure.

Specifically in the embodiments of the WOLED component as shown in FIG. 2A, the second light-emitting layer 9 of each pair of adjacent light-emitting unit 4 are separated from one another through the insulating member 8 configured over the pixel defining layer 7. Yet in some other embodiments of the WOLED component as shown in FIG. 3, the second light-emitting layer 9 of each light-emitting unit 4 substantially forms an integrated structure.

It should be noted that, even if the second light-emitting layer 9 of each pair of adjacent light-emitting units 4 are integrated, the second light-emitting layer 9 of each pair of adjacent light-emitting units 4 will not transmit charges to each other, and thus whether the second light-emitting layer 9 of each pair of adjacent light-emitting units 4 are connected or disconnected will not influence the display effect of the WOLED component in embodiments of the present disclosure. As such, in the present disclosure, the second light-emitting layer 9 of each pair of adjacent light-emitting units 4 can be separated by the insulating member 8 configured over the pixel defining layer 7, or they can be integrated.

The above different configurations for the second light-emitting layer 9 can be realized by controlling a distance of an upper surface of the second light-emitting layer 9 to the upper surface of the pixel defining layer 7 (i.e. a sum of a thickness of the first light-emitting layer 6, a thickness of the charge generation layer 1, and a thickness of the second light-emitting layer 9 in the embodiment shown in FIG. 2A, denoted as b (not shown in the drawings)) relative to the thickness h of the insulating member 8 to thereby influence the deposition process of the second light-emitting layer 9.

Specifically, if the sum b of the thickness of the first light-emitting layer 6, the thickness of the charge generation layer 1, and the thickness of the second light-emitting layer 9 is smaller than the thickness h of the insulating member 8, i.e. the thickness relationship satisfies:

$$b < h; \qquad (4)$$

then during the process of depositing the second light-emitting layer 9, the insulating member 8 can also separate the second light-emitting layer 9 of each pair of adjacent light-emitting units 4 due to the shadow effect of the side surface of the insulating member 8.

Alternatively, if the sum of the thickness of the first light-emitting layer 6, the thickness of the charge generation layer 1, and the thickness of the second light-emitting layer 9 is larger than, or equal to, the thickness h of the insulating member 8, i.e. the thickness relationship satisfies $$b \geq h; \qquad (5)$$

then during the process of depositing the second light-emitting layer 9, the second light-emitting layer 9 can form an integrated structure.

In a manner and configuration similar to the second light-emitting layer 9, the third light-emitting layer 10 can also be separated by the insulating member 8 configured over the pixel defining layer 7 or can form an integrated structure.

Specifically, by controlling that a distance of an upper surface of the third light-emitting layer 10 to the upper surface of the pixel defining layer 7 (i.e. a sum of a thickness of the first light-emitting layer 6, a thickness of the charge generation layer 1, a thickness of the second light-emitting layer 9, and a thickness of the third light-emitting layer 10 in the embodiment shown in FIG. 2A, denoted as c (not shown in the drawings)) is smaller than the thickness h of the insulating member 8, i.e. the thickness relationship satisfies:

$$c < h; \qquad (6)$$

then during the process of depositing the third light-emitting layer 10, the insulating member 8 can also separate the third light-emitting layer 10 of each pair of adjacent light-emitting units 4 due to the shadow effect of the side surface of the insulating member 8.

Alternatively, if the sum c of the thickness of the first light-emitting layer 6, the thickness of the charge generation layer 1, the thickness of the second light-emitting layer 9, and the thickness of the third light-emitting layer 10 is smaller than the thickness h of the insulating member 8, i.e. the thickness relationship satisfies $$c \geq h; \qquad (7)$$

then during the process of depositing the third light-emitting layer 10, the third light-emitting layer 10 can form an integrated structure.

In addition, each light-emitting unit 4 can further comprise a first hole injection layer between the anode 5 and the first light-emitting layer 6, and a first hole transport layer between the first hole injection layer and the first light-emitting layer 5. Herein, the first hole injection layer and the first hole transport layer of each pair of adjacent light-emitting units 4 are separated from each other through the insulating member 8 configured over the pixel defining layer 7.

Accordingly, in some embodiments of WOLED component, the sum of the thickness of the first light-emitting layer 6, the first hole injection layer, the first hole transport layer and the charge generation layer 1 (i.e. the distance of the upper surface of the charge generation layer 1 to the upper surface of the pixel defining layer 7) is configured to be smaller than the thickness of the insulating member 8.

As a result, during the manufacturing process of the aforementioned WOLED component, when forming the first light-emitting layer 6, the first hole injection layer, the first hole transport layer and the charge generation layer 1 by deposition, the first light-emitting layer 6, the first hole injection layer, the first hole transport layer and the charge generation layer 1 deposited will not climb along the side surface of the an inverted trapezoidal insulating member 8 due to the shadow effect of the side surface of the insulating member 8. As such, each of these above layers formed will be separated from the first light-emitting layer 6, the first hole injection layer, the first hole transport layer and the charge generation layer 1 deposited at the upper surface of the insulating member 8.

Thereby, the first light-emitting layer 6, the first hole injection layer, the first hole transport layer and the charge generation layer 1 of each pair of adjacent light-emitting units 4 are separated from one another.

Each light-emitting unit 4 can further comprise a second hole injection layer between the charge generation layer 1 and the second light-emitting layer 9, and a second hole transport layer between the second hole injection layer and the second light-emitting layer 9.

Depending on different embodiments of the WOLED component, the second hole injection layer and the second hole transport layer of each pair of adjacent light-emitting units 4 can both be separated from each other through the insulating member 8 configured over the pixel defining layer 7, or alternatively, the second hole injection layer of each light-emitting unit 4 forms an integrated structure, and the second hole transport layer of each light-emitting unit 4 also forms an integrated structure.

Similar to the second light-emitting layer 9, on the one hand, even if the second hole injection layer of each pair of light-emitting units 4 are integrated, the second hole injection layer of each pair of light-emitting units 4 will not transmit charges to each other. On the other hand, even if the second hole transport layer of each pair of light-emitting units 4 are integrated, the second hole transport layer of each pair of light-emitting units 4 will not transmit charges to each other.

As a result, whether the second hole injection layer of each pair of adjacent light-emitting units 4 are connected and whether and second hole transport layer of each pair of adjacent light-emitting units 4 are connected or not will not influence the display effect of the WOLED component disclosed herein.

As such, in the WOLED component disclosed herein, the second hole injection layer of each pair of adjacent light-emitting units 4 can be separated by the insulating member 8 configured over the pixel defining layer 7, or alternatively can form an integrated structure. The second hole transport layer of each pair of adjacent light-emitting units 4 can be separated by the insulating member 8 configured over the pixel defining layer 7, or alternatively can form an integrated structure.

In some embodiments, the material of the insulating member 8 and the pixel defining layer 7 can comprise a photopolymeric photosensitive resin or light compound photosensitive resin, it may also be other insulating composites, there are no limitations herein.

It is noted that in any embodiment of the WOLED component described above, due to the shadow effect of the side surface of the insulating member 8 that is disposed on top of the pixel defining layer 7 (more specifically on a side of the pixel defining layer distal to the substrate 3), formation of the charge generation layer 1 that is configured such that portions thereof corresponding to any adjacent light-emitting units are physically separated from one another can be realized by evaporation or deposition without the use of a mask. As such, the manufacturing process can be simplified and the manufacturing cost can be reduced.

Similarly, formation of other layers in each light-emitting unit that is above the anode 5 and below the charge generation layer 1, such as the first light-emitting layer 6, the first hole injection layer, the first hole transport layer, as well as other layers that is above the charge generation layer 1, such as the second hole injection layer, the second hole transport layer, the second light-emitting layer 9, the third light-emitting layer 10, and the cathode 11, can further be realized by evaporation or deposition without the use of a mask, resulting in a simplified manufacturing process and reduced manufacturing cost. It is noted that a mask can still be used for the formation of each layer of each light-emitting unit above the anode 5.

In a second aspect, embodiments of the present disclosure further provide a manufacturing method of a WOLED component. The WOLED component can be based on any one of the embodiments as described above.

Figure 4:
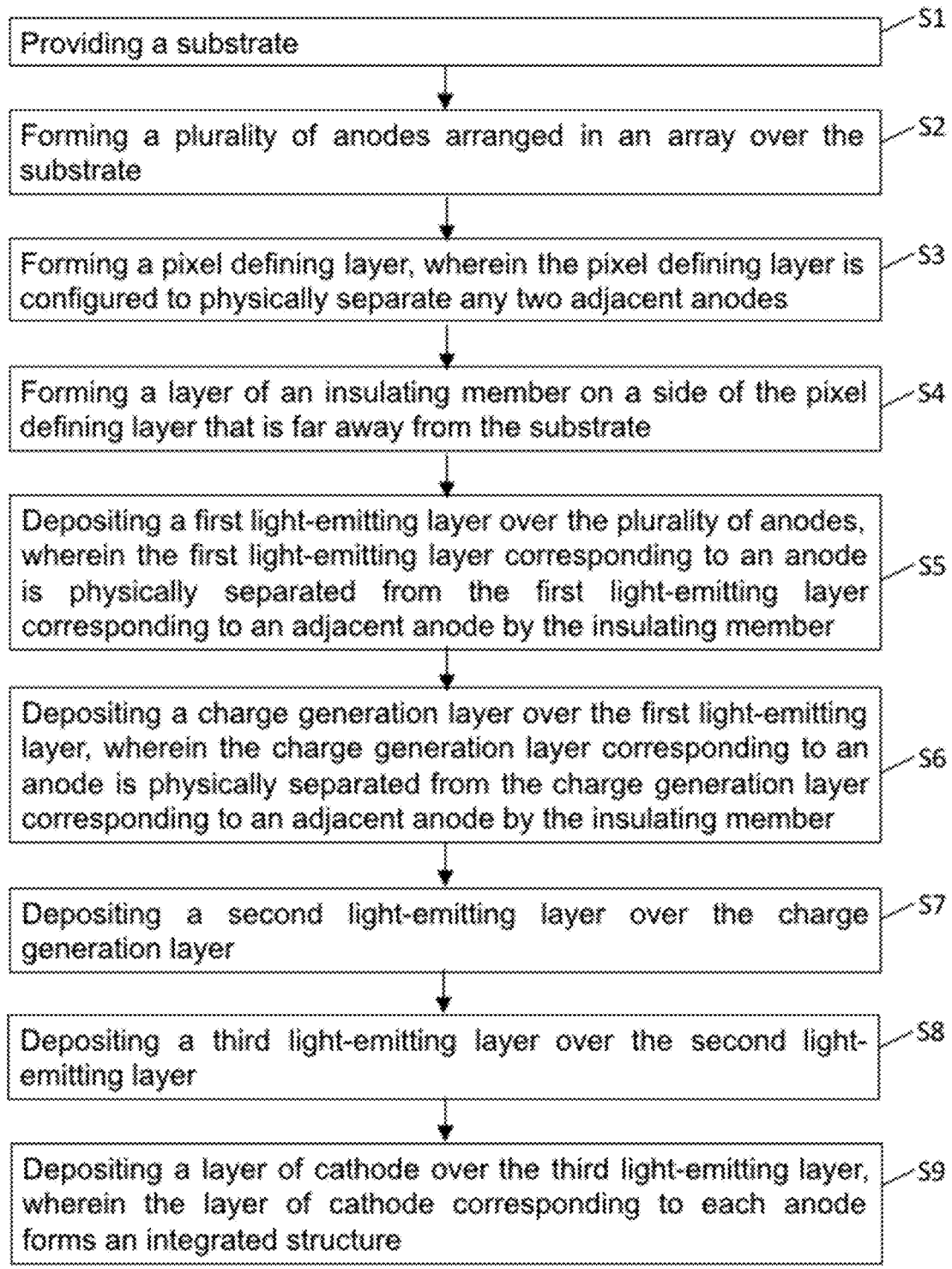
FIG. 4 is a flowchart of the manufacturing method of the WOLED component provided by embodiments of the present disclosure.

FIG. 4 shows a flowchart of the manufacturing method of a WOLED component. As shown in FIG. 4, the manufacturing method of the WOLED component comprises the following steps:

Step S1: Providing a substrate 3.

Herein the substrate can be a glass base substrate or another transparent substrate.

Step S2: Forming a plurality of anodes 5 arranged in an array over the substrate 3.

The material for the plurality of anodes can be a metal film, ITO film or a film made of mixture of metal and ITO, which can be deposited over the substrate followed by a patterning process to thereby form the plurality of anodes. Herein the patterning process is referred to as steps such as coating photoresist, exposure, development, etching and lifting-off of photoresist.

Figure 5:
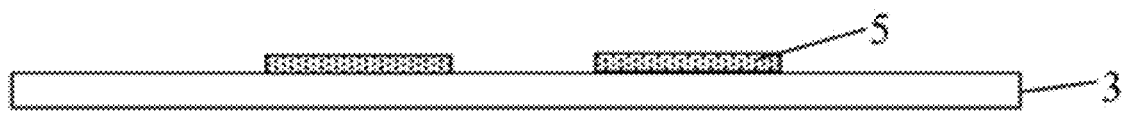
FIG. 5 is a cross-sectional view of the structure formed after step S2 of FIG. 4.

After the step S2 is completed, a cross-sectional view of the structure formed thereby is specifically illustrated in FIG. 5.

Step S3: Forming a pixel defining layer 7, wherein the pixel defining layer is configured to physically separate any two adjacent anodes 5.

According to some embodiments, a patterning process including spin-coating of a photopolymeric photosensitive resin or a light compound photosensitive resin over the structure as shown in FIG. 5, is performed to thereby form the pixel defining layer 7. The pixel defining layer 7 is configured to have a pattern such that it physically separates, and thus electrically insulate, any two adjacent anodes 5.

Figure 6:
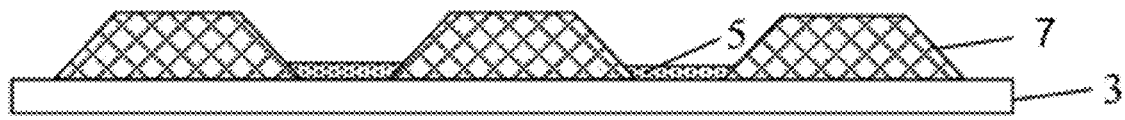
FIG. 6 is a cross-sectional view of the structure formed after step S3 of FIG. 4.

After step S3 is completed, a cross-sectional view of the structure formed thereby is specifically illustrated in FIG. 6 is formed. As shown, the pixel defining layer 7 is formed between any two adjacent anodes 5, and the shape of the pixel defining layer may be a trapezoidal shape as shown in FIG. 6.

Step S4: Forming a layer of an insulating member 8 on a side of the pixel defining layer 7 that is far away from the substrate 3.

In some embodiments, a patterning process including spin-coating of a photopolymeric photosensitive resin or a light compound photosensitive resin over the structure as shown in FIG. 6, is performed to thereby form the layer of an insulating member 8.

Figure 7:
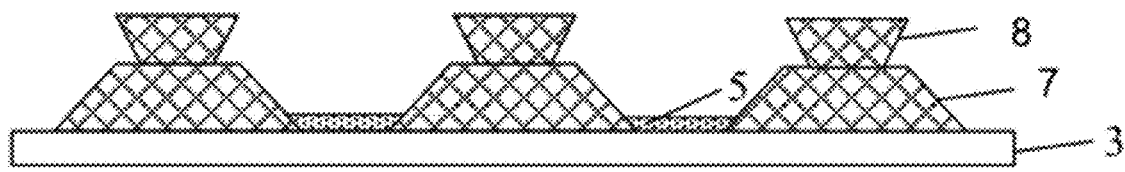
FIG. 7 is a cross-sectional view of the structure formed after step S4 of FIG. 4.

After step S4 is completed, a cross-sectional view of the structure formed thereby is specifically illustrated in FIG. 7. As shown, the insulating member 8 is formed between each pair of adjacent anodes 5, and specifically on a side of the pixel defining layer 7 that is far away from the substrate 3 (i.e. on a upper surface of the pixel defining layer 7). Herein the insulating member 8 is an inverted trapezoidal insulating member as shown in FIG. 7.

Step S5: Forming a first light-emitting layer 6 over the plurality of anodes 5, wherein the first light-emitting layer corresponding to an anode 5 is physically separated from the first light-emitting layer corresponding to an adjacent anode 5 by the insulating member 8.

Herein, formation of the first light-emitting layer 6 can be realized by evaporation or deposition without the use of a mask. It is noted that according to some other embodiments, a mask can still be adopted over the structure as shown in FIG. 7 for the formation of the first light-emitting layer 6 over the plurality of anodes 5.

Figure 8:
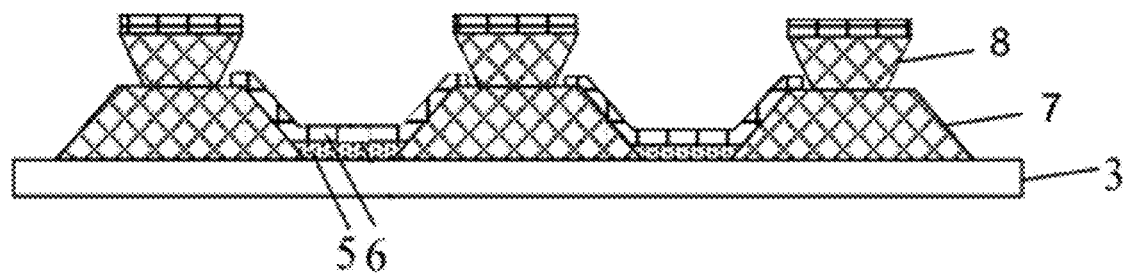
FIG. 8 is a cross-sectional view of the structure formed after step S5 of FIG. 4.

After step S5 is completed, a cross-sectional view of the structure formed thereby is specifically illustrated in FIG. 8. As shown, the first light-emitting layer 6 corresponding to an anode 5 is separated from the first light-emitting layer 6 corresponding to an adjacent anode 5 by the insulating member 8.

Step S6: Forming a charge generation layer 1 over the first light-emitting layer 6, wherein the charge generation layer corresponding to any anode 5 is physically separated or disconnected from the charge generation layer corresponding to an adjacent anode 5 by the insulating member 8.

Herein, due to the shadow effect of the side surface of the insulating member 8, formation of the charge generation layer 1 that is configured such that portions thereof corresponding to any adjacent light-emitting units are physically separated from one another can be realized by evaporation or deposition without the use of a mask.

Similarly, a mask can still be adopted over the structure as shown in FIG. 8 to thereby form the charge generation layer 1 over the first light-emitting layer 6. Herein, the material of the charge generation layer can be an organic material or an inorganic material containing elemental lithium.

Figure 9:
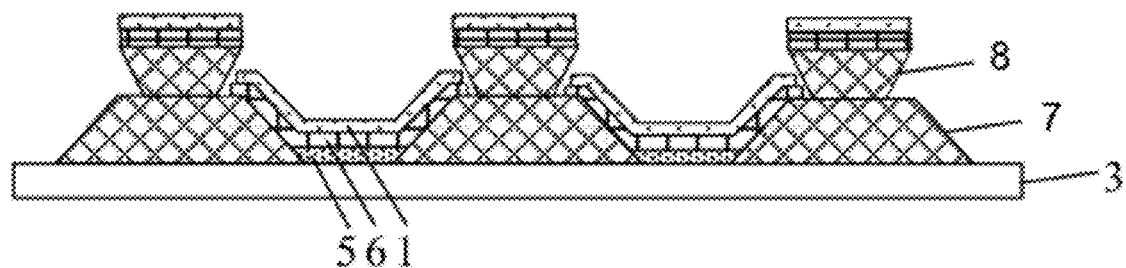
FIG. 9 is a cross-sectional view of the structure formed after step S6 of FIG. 4.

After step S6 is completed, a cross-sectional view of the structure formed thereby is specifically illustrated in FIG. 9. As shown, the charge generation layer 1 corresponding to an anode 5 is physically separated or disconnected from the charge generation layer 1 corresponding to an adjacent anode 5 by the insulating member 8.

Herein it is noted that it shall be configured such that a sum of a thickness of the first light-emitting layer 6 and the charge generation layer 1 is smaller than a thickness of the insulating member 8, such that during the deposition process of the charge generation layer 1, the charge generation layer 1 corresponding to an anode 5 is physically separated or disconnected from the charge generation layer 1 corresponding to an adjacent anode 5 by the insulating member 8.

The beneficial effects of the manufacturing method of the WOLED component are the same as the aforementioned beneficial effects of the WOLED component, it will not be repeated herein.

In some embodiments, as shown in FIG. 4, after the step S6 of depositing the charge generation layer 1 over the first light-emitting layer 6, the manufacturing method of the WOLED component can further comprises:

Step S7: Forming a second light-emitting layer 9 over the charge generation layer 1.

Herein, formation of the second light-emitting layer 9 can be realized by evaporation or deposition without the use of a mask. It is noted that a mask can similarly be adopted over the structure as shown in FIG. 9 to thereby deposit the second light-emitting layer 9 over the charge generation layer 1.

Figure 10A:
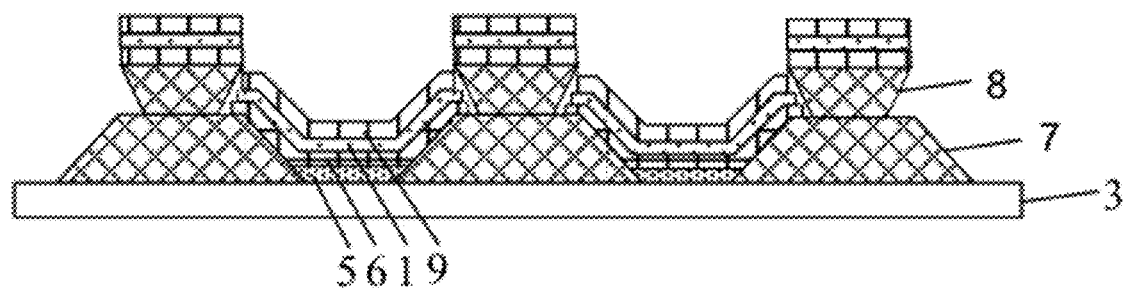
FIG. 10A is a cross-sectional view of the first type of structure formed after step S7 of FIG. 4 according to some embodiments of the disclosure.
Figure 10B:
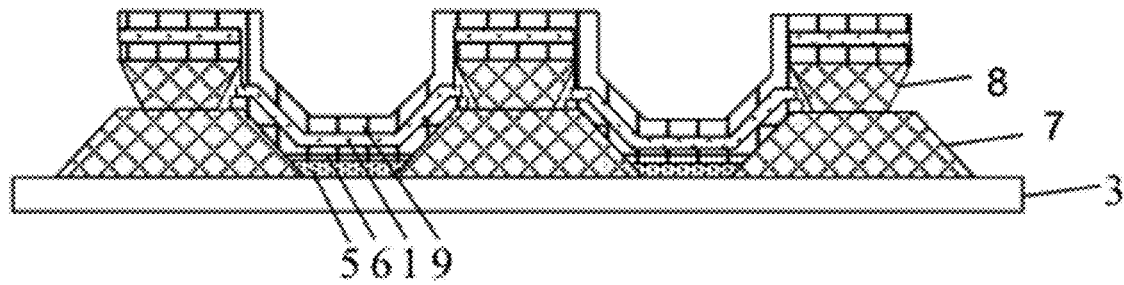
FIG. 10B is a cross-sectional view of the second type of structure formed after step S7 of FIG. 4 according to some other embodiments of the disclosure.

After step S7 is completed, a cross-sectional view of the structure formed thereby is specifically illustrated in FIG. 10A or FIG. 10B.

According to some embodiments as illustrated in FIG. 10A, where the second light-emitting layer 9 corresponding to any anode 5 is physically separated from the second light-emitting layer 9 corresponding to an adjacent anode 5 by the insulating member 8.

According to some other embodiments as illustrated in FIG. 10B, the second light-emitting layer 9 corresponding to each anode 5 forms an integrated structure.

Step S8: Forming a third light-emitting layer 10 over the second light-emitting layer 9.

Herein, formation of the third light-emitting layer 10 can be realized by evaporation or deposition without the use of a mask. It is noted that a mask can similarly be adopted over the structure as shown in FIG. 10A or FIG. 10B to thereby deposit third light-emitting layer 10 over the second light-emitting layer 9, as respectively illustrated in FIG. 11A and FIG. 11B.

Figure 11A:
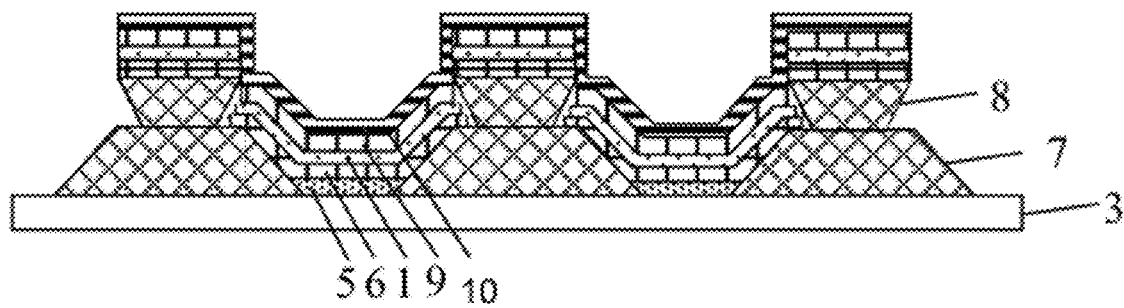
FIG. 11A is a cross-sectional view of the first type of structure formed after step S8 according to some other embodiments of the disclosure.
Figure 11B:
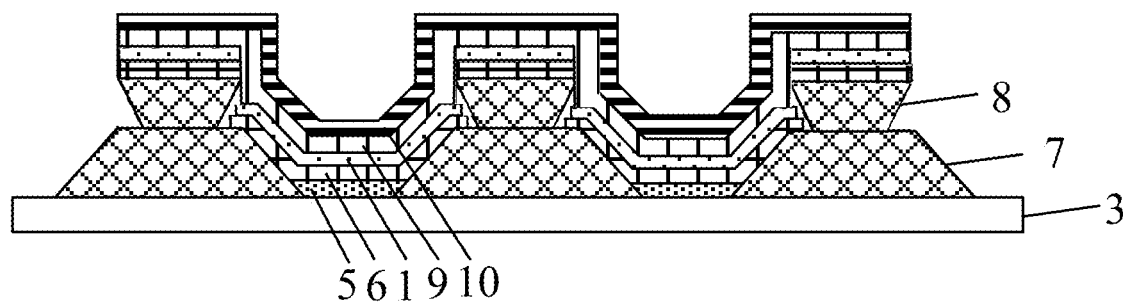
FIG. 11B is a cross-sectional view of the second type of structure formed after step S8 according to some other embodiments of the disclosure.

After step S8 is completed, a cross-sectional view of the structure formed thereby is respectively illustrated in FIG. 11A or FIG. 11B. Herein, in both of the embodiments, the third light-emitting layer 10 corresponding to each anode 5 are integrated.

It should be noted, in addition to the embodiments as illustrated in FIG. 11A and FIG. 11B, other embodiments are also possible. For example, the third light-emitting layer 10 corresponding to any anode 5 may also be separated from the third light-emitting layer 10 corresponding to any adjacent anode 5 through the insulating member 8.

Step S9: Forming a layer of cathode 11 over the third light-emitting layer 10, wherein the layer of cathode 11 corresponding to each anode 5 forms an integrated structure.

Herein, formation of the layer of cathode 11 can be realized by evaporation or deposition without the use of a mask. It is noted that a mask may similarly be adopted to deposit the cathode 11 over the third light-emitting layer 10 as illustrated in FIG. 11A and FIG. 11B to thereby deposit the layer of cathode 11 over the third light-emitting layer 10.

After step S9 is completed, a cross-sectional view of the WOLED component as shown in FIG. 2A or FIG. 3 is thereby formed. Herein, the cathodes 11 corresponding to each anode 5 are all connected, that is, the cathode 11 deposited forms an integrated layer. The anode 5, the first light-emitting layer 6, the charge generation layer 1, the second light-emitting layer 9, the third light-emitting layer 10 and the cathode 11 together forms a light-emitting unit 4.

In the embodiments of the manufacturing method described above, during the process of depositing the first light-emitting layer 6, the charge generation layer 1, the second light-emitting layer 9, the third light-emitting layer 10 and the cathode 11, it shall be configured such that a sum of a thickness of the first light-emitting layer 6, a thickness of the charge generation layer 1, a thickness of the second light-emitting layer 9, a thickness of the third light-emitting layer 10, and a thickness of the cathode 11 is larger than, or equal to, a thickness of the insulating member 8 to thereby allow the cathode 11 can form an integrated layer.

In embodiments where a first hole injection layer is configured between the anode 5 and the first light-emitting layer 6, and a first hole transport layer is configured between the first hole injection layer and the first light-emitting layer 6, after the aforementioned step S4 and before the step S5, the manufacturing method of the WOLED component may further comprise:

depositing the first hole injection layer and the first hole transport layer successively over the first light-emitting layer 6, wherein the first hole injection layer corresponding to an anode 5 is physically separated from the first hole injection layer corresponding to an adjacent anode 5 by the insulating member 8, and the first hole transport layer corresponding to an anode 5 is physically separated from the first hole transport layer corresponding to an adjacent anode 5 by the insulating member 8.

Furthermore, in embodiments where a second hole injection layer is configured between the charge generation layer 1 and the second light-emitting layer 9, and a second hole transport layer is configured between the second hole injection layer and the second light-emitting layer 9, after the aforementioned step S6 and before the step S7, the manufacturing method of the WOLED component may further comprise:

depositing successively the second hole injection layer and the second hole transport layer over the charge generation layer 1.

Herein the second hole injection layer corresponding to an anode 5 can be physically separated from the second hole injection layer corresponding to an adjacent anode 5 by the insulating member 8, or alternatively, the second hole injection layer corresponding to each anode 5 can form an integrated structure.

The second hole transport layer corresponding to an anode 5 can be physically separated from the second hole transport layer corresponding to an adjacent anode 5 through the insulating member 8, or alternatively, the second hole transport layer corresponding to each anode 5 can form an integrated structure.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method for manufacturing an organic light-emitting diode (OLED) component, comprising:
   providing a substrate, a plurality of first electrodes, and a pixel defining layer, wherein that the plurality of first electrodes and the pixel defining layer are over the substrate, and the plurality of first electrodes are physically separated from one another by the pixel defining layer;
   forming an insulating layer over, and positionally corresponding to, the pixel defining layer;
   forming a first light-emitting layer over, and positionally corresponding to, each of the plurality of first electrodes;
   forming a charge generation layer over the insulating layer and the first light-emitting layer without a mask;
   forming a second light-emitting layer over the charge generation layer;
   forming a third light-emitting layer over the second light-emitting layer; and
   forming a second electrode over the third-light emitting layer;
   wherein:
      the insulating layer and the charge generation layer are configured such that after formation of the charge generation layer, portions thereof positionally corresponding to any two adjacent first electrodes are physically separated by the insulating layer; and
      a sum of a thickness of the first light-emitting layer, a thickness of the charge generation layer, a thickness of the second light-emitting layer, a thickness of the third light-emitting layer, and a thickness of the second electrode is larger than, or equal to, a thickness of the insulating layer.

2. The method of claim 1, wherein the insulating layer is configured such that an orthographic projection of a side surface thereof facing any one of the plurality of first electrodes on an upper surface of the pixel defining layer casts a shadow thereupon.

3. The method of claim 2, wherein the insulating layer is configured to have a shape of an inverted trapezoidal in a cross section thereof along a plane perpendicular to the substrate.

4. The method of claim 1, wherein the forming a charge generation layer over the insulating layer and the first light-emitting layer without a mask is performed by at least one of evaporation, deposition, or sputtering.

5. The method of claim 2, wherein the first light-emitting layer is formed on each of the plurality of first electrodes, wherein:
   a sum of a thickness of the first light-emitting layer and a thickness of the charge generation layer is smaller than a thickness of the insulating layer.

6. The method of claim 2, further comprising, between the forming an insulating layer over, and positionally corresponding to, the pixel defining layer and the forming a first light-emitting layer over, and positionally corresponding to, each of the plurality of first electrodes:

forming a first hole injection layer and a first hole transport layer successively on, and positionally corresponding to, each of the plurality of first electrodes, wherein:
a sum of a thickness of the first hole injection layer, a thickness of the first hole transport layer, a thickness of the first light-emitting layer, and a thickness of the charge generation layer is smaller than a thickness of the insulating layer.

7. The method of claim 1, further comprising:
forming a second electrode layer over the charge generation layer, such that portions thereof positionally corresponding to any two adjacent first electrodes are integrated with one another.

8. The method of claim 7, further comprising, between the forming a charge generation layer without a mask over the insulating layer and the first light-emitting layer and the forming a second electrode layer over the charge generation layer:
forming at least one other light-emitting layer over the charge generation layer and below the second electrode layer.

9. The method of claim 8, wherein the first light-emitting layer and the at least one other light-emitting layer are configured to respectively emit a light of a different primary color which, upon mixing together, become a white light.

10. The method of claim 8, wherein the forming at least one other light-emitting layer over the charge generation layer and below the second electrode layer comprises:
forming a second light-emitting layer over the charge generation layer; and
forming a third light-emitting layer over the second light-emitting layer.

11. The method of claim 8, further comprising, between the forming a charge generation layer over the insulating layer and the first light-emitting layer without a mask and the forming at least one other light-emitting layer over the charge generation layer and below the second electrode layer:
forming a second hole injection layer and a second hole transport layer successively over the charge generation layer.

12. An organic light-emitting diode component, comprising:
a substrate;
a pixel defining layer over the substrate;
a plurality of first electrodes over the substrate, physically separated from one another by the pixel defining layer;
an insulating layer, positionally correspondingly disposed over the pixel defining layer;
a first light-emitting layer over each of the plurality of first electrodes;
a charge generation layer over the first light-emitting layer, configured such that portions thereof positionally corresponding to any two adjacent first electrodes are physically separated by the insulating layer;
a second light-emitting layer over the charge generation layer;
a third light-emitting layer over the second light-emitting layer; and
a second electrode over the third-light emitting layer;
wherein a sum of a thickness of the first light-emitting layer, a thickness of the charge generation layer, a thickness of the second light-emitting layer, a thickness of the third light-emitting layer, and a thickness of the second electrode is larger than, or equal to, a thickness of the insulating layer.

13. The organic light-emitting diode component of claim 12, wherein the insulating layer is configured such that an orthographic projection of a side surface thereof facing any one of the plurality of first electrodes on an upper surface of the pixel defining layer casts a shadow thereupon.

14. The organic light-emitting diode component of claim 13, wherein the insulating layer has a shape of an inverted trapezoidal in a cross section thereof along a plane perpendicular to the substrate.

15. The organic light-emitting diode component of claim 12, further comprising at least one other light-emitting layer over the charge generation layer.

16. The organic light-emitting diode component of claim 15, the first light-emitting layer and the at least one other light-emitting layer are configured to respectively emit a light of a different primary color which, upon mixing together, become a white light.

17. The organic light-emitting diode component of claim 16, wherein the at least one other light-emitting layer comprises:
a second light-emitting layer over the charge generation layer; and
a third light-emitting layer over the second light-emitting layer.

18. The organic light-emitting diode component of claim 17, wherein the first light-emitting layer, the second light-emitting layer, and the third light-emitting layer are configured to respectively emit a blue light, a red light, and a green light.

19. The organic light-emitting diode component of claim 12, further comprising:
a first hole injection layer each of the plurality of first electrodes; and
a first hole transport layer over the first hole injection layer.

20. The organic light-emitting diode component of claim 15, further comprising a second electrode over the at least one other light-emitting layer, wherein the second electrode has an integrated structure.

* * * * *